(12) United States Patent
Wada et al.

(10) Patent No.: US 8,765,523 B2
(45) Date of Patent: Jul. 1, 2014

(54) METHOD FOR MANUFACTURING SEMICONDUCTOR DEVICE INCLUDING SCHOTTKY ELECTRODE

(71) Applicant: Sumitomo Electric Industries, Ltd., Osaka (JP)

(72) Inventors: Keiji Wada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/670,119

(22) Filed: Nov. 6, 2012

(65) Prior Publication Data

US 2013/0149850 A1    Jun. 13, 2013

Related U.S. Application Data

(60) Provisional application No. 61/567,922, filed on Dec. 7, 2011.

(30) Foreign Application Priority Data

Dec. 7, 2011 (JP) ................. 2011-267604

(51) Int. Cl.
    *H01L 21/00* (2006.01)
    *H01L 21/28* (2006.01)
(52) U.S. Cl.
    USPC ........... 438/105; 438/570; 438/571; 438/572; 438/931; 257/73; 257/77; 257/453; 257/471; 257/E21.359; 257/E29.104; 257/E29.338
(58) Field of Classification Search
    USPC ....... 438/105, 570, 571, 572, 931, FOR. 335, 438/FOR. 336, FOR. 490; 257/73, 77, 453, 257/471, E21.359, E29.104, E29.338
    See application file for complete search history.

(56) References Cited

U.S. PATENT DOCUMENTS 7,508,045 B2 *  3/2009  Nishio et al. ............ 257/452
2009/0227098 A1  9/2009  Matsuyama
(Continued)

FOREIGN PATENT DOCUMENTS

JP    9-246573       9/1997
JP    2006-253521 A  9/2006
(Continued)

OTHER PUBLICATIONS

International Search Report and Written Opinion in PCT International Application No. PCT/JP2012/077858, dated Jan. 29, 2013.

*Primary Examiner* — Thanh V Pham
(74) *Attorney, Agent, or Firm* — Venable LLP; Michael A. Sartori; Tamatane J. Aga

(57) ABSTRACT

A method for manufacturing a semiconductor device includes the steps of preparing a substrate made of silicon carbide and having an n type region formed to include a main surface, forming a p type region in a region including the main surface, forming an oxide film on the main surface across the n type region and the p type region, by heating the substrate having the p type region formed therein at a temperature of 1250° C. or more, removing the oxide film to expose at least a part of the main surface, and forming a Schottky electrode in contact with the main surface that has been exposed by removing the oxide film.

7 Claims, 6 Drawing Sheets

(56) References Cited

U.S. PATENT DOCUMENTS

| | | |
|---|---|---|
| 2010/0221917 A1 | 9/2010 | Masuda |
| 2011/0018005 A1 | 1/2011 | Nakano |
| 2011/0175106 A1* | 7/2011 | Mizukami et al. ............. 257/77 |
| 2012/0056198 A1* | 3/2012 | Ota et al. ..................... 257/77 |
| 2013/0140584 A1* | 6/2013 | Kameshiro et al. ........... 257/77 |

FOREIGN PATENT DOCUMENTS

| | | |
|---|---|---|
| JP | 2009-212366 A | 9/2009 |
| JP | 2009-253072 A | 10/2009 |
| JP | 2010-067937 A | 3/2010 |
| JP | 2011-044688 A | 3/2011 |
| WO | WO-2007/086196 A1 | 8/2007 |

* cited by examiner

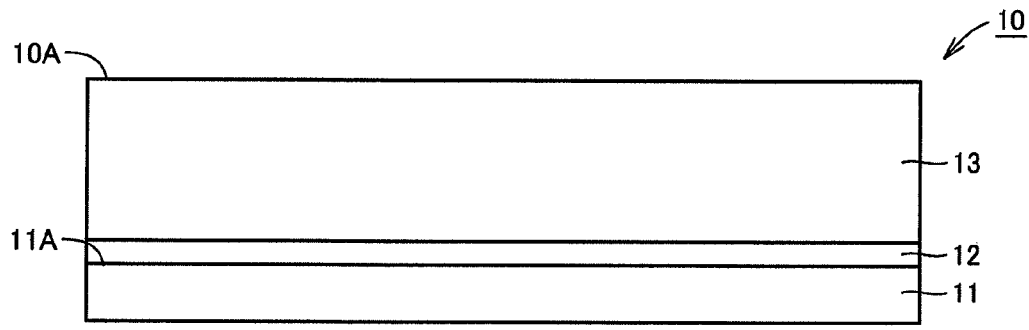
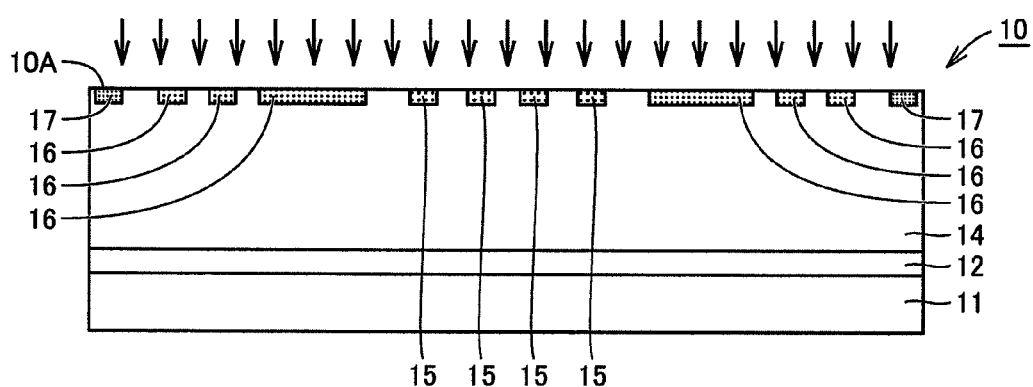
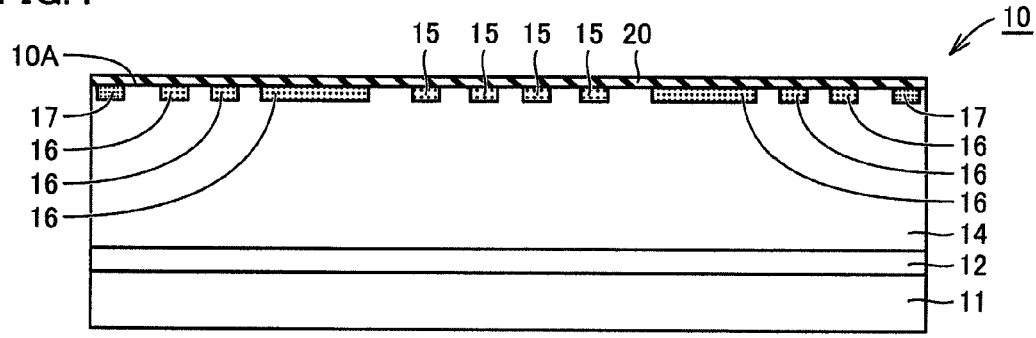

METHOD FOR MANUFACTURING SEMICONDUCTOR DEVICE INCLUDING SCHOTTKY ELECTRODE

BACKGROUND OF THE INVENTION

1. Field of the Invention

The present invention relates to a method for manufacturing a semiconductor device, and more particularly to a method for manufacturing a semiconductor device capable of achieving improved breakdown voltage characteristics.

2. Description of the Background Art

Semiconductor devices such as a Schottky barrier diode (SBD) and a junction barrier Schottky diode (JBS) have a structure in which a Schottky electrode is formed on a substrate. To improve breakdown voltage characteristics of the SBD and JBS, a satisfactory contact state between the substrate and the Schottky electrode needs to be secured. For this reason, it has been proposed to form an oxide film in advance on a substrate surface on which a Schottky electrode is to be formed, and to form the Schottky electrode on the clean substrate surface obtained by removing the oxide film (see Japanese Patent Laying-Open No. 9-246573, for example).

To further improve the breakdown voltage characteristics of the SBD and JBS, there is a need for a manufacturing method capable of further enhancing the contact state between the substrate and the Schottky electrode.

SUMMARY OF THE INVENTION

The present invention was made in view of the problems described above, and an object of the present invention is to provide a method for manufacturing a semiconductor device capable of achieving improved breakdown voltage characteristics.

A method for manufacturing a semiconductor device of the present invention includes the steps of preparing a substrate made of silicon carbide and having a first conductivity type region formed to include one main surface, forming a second conductivity type region in a region including the main surface, forming an oxide film on the main surface across the first conductivity type region and the second conductivity type region, by heating the substrate having the second conductivity type region formed therein at a temperature of 1250° C. or more, removing the oxide film to expose at least a part of the main surface, and forming a Schottky electrode in contact with the main surface that has been exposed by removing the oxide film.

The present inventors conducted detailed studies of means for improving breakdown voltage characteristics of a semiconductor device, and arrived at the present invention based on the following findings.

The present inventors found that, when forming an oxide film by heating a substrate in a method for manufacturing a semiconductor device, different rates of formation of the oxide film between a first conductivity type region and a second conductivity type region causes exaggerated roughness of an interface between a main surface of the substrate exposed by removing the oxide film, or the substrate, and the oxide film. The present inventors also found that, if the oxide film is formed by heating the substrate at a temperature of 1250° C. or more, the rate of formation of the oxide film can be less dependent on the conductivity type to thereby reduce the roughness, to arrive at the present invention.

In the method for manufacturing a semiconductor device according to the present invention, the substrate is heated at a temperature of 1250° C. or more in the step of forming the oxide film. Thus, the rate of formation of the oxide film can be less dependent on the conductivity type, to form the oxide film with suppressed variation in film thickness. Accordingly, the surface roughness of the main surface of the substrate exposed by removing the oxide film can be reduced, to obtain a satisfactory contact state between the substrate and the Schottky electrode formed on the main surface of the substrate. According to the method for manufacturing a semiconductor device of the present invention, therefore, by obtaining the satisfactory contact state between the substrate and the Schottky electrode, a method for manufacturing a semiconductor device capable of achieving improved breakdown voltage characteristics can be provided.

In the method for manufacturing a semiconductor device, in the step of forming an oxide film, the oxide film may be formed on the main surface by heating the substrate at a temperature of 1300° C. or more. As such, variation in film thickness of the formed oxide film can be suppressed more effectively.

In the method for manufacturing a semiconductor device, in the step of removing the oxide film, the oxide film may be removed to expose a part of the main surface. In the step of forming a Schottky electrode, the Schottky electrode may be formed in contact with the main surface that has been exposed by removing the oxide film and with the oxide film.

As such, the remaining oxide film can function as an electric field relaxation FP (Field Plate), to further improve the breakdown voltage characteristics of the semiconductor device. Furthermore, after the step of forming an oxide film by heating the substrate, the step of further depositing an oxide film on this oxide film can be performed. In the step of removing the oxide film, the oxide film formed by heating the substrate and the oxide film deposited on this oxide film may be removed to expose a part of the main surface of the substrate. As such, the oxide film having a greater thickness can be left, to further improve the function of the oxide film as an electric field relaxation FP.

The method for manufacturing a semiconductor device may further include the step of heating the substrate having the oxide film formed thereon in a nitrogen-containing atmosphere, before the step of removing the oxide film.

As such, an interface state of a region including the interface between the oxide film and the silicon carbide that forms the substrate can be reduced, to further improve the breakdown voltage characteristics of the semiconductor device.

In the method for manufacturing a semiconductor device, in the step of forming an oxide film, the oxide film having a thickness of 0.1 μm or more may be formed. As such, the thickness of the oxide film can be set within a practically suitable range.

In the method for manufacturing a semiconductor device, in the step of removing the oxide film, the oxide film may be removed to expose the entire main surface. As such, the semiconductor device without the oxide film functioning as an electric field relaxation FP can be readily manufactured.

In the method for manufacturing a semiconductor device, in the step of forming a Schottky electrode, the Schottky electrode including at least one selected from the group consisting of Ti, W, Mo, Ni, Ta, Al and Au may be formed.

As such, various types of metals capable of making Schottky contact with the substrate can be employed as a metal that forms the Schottky electrode.

As is clear from the description above, according to the method for manufacturing a semiconductor device of the present invention, a method for manufacturing a semiconductor device capable of achieving improved breakdown voltage characteristics can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic cross-sectional view illustrating the method for manufacturing a JBS.

FIG. 3 is a schematic cross-sectional view illustrating the method for manufacturing a JBS.

FIG. 4 is a schematic cross-sectional view illustrating the method for manufacturing a JBS.

DESCRIPTION OF THE PREFERRED EMBODIMENTS

Figure 1:
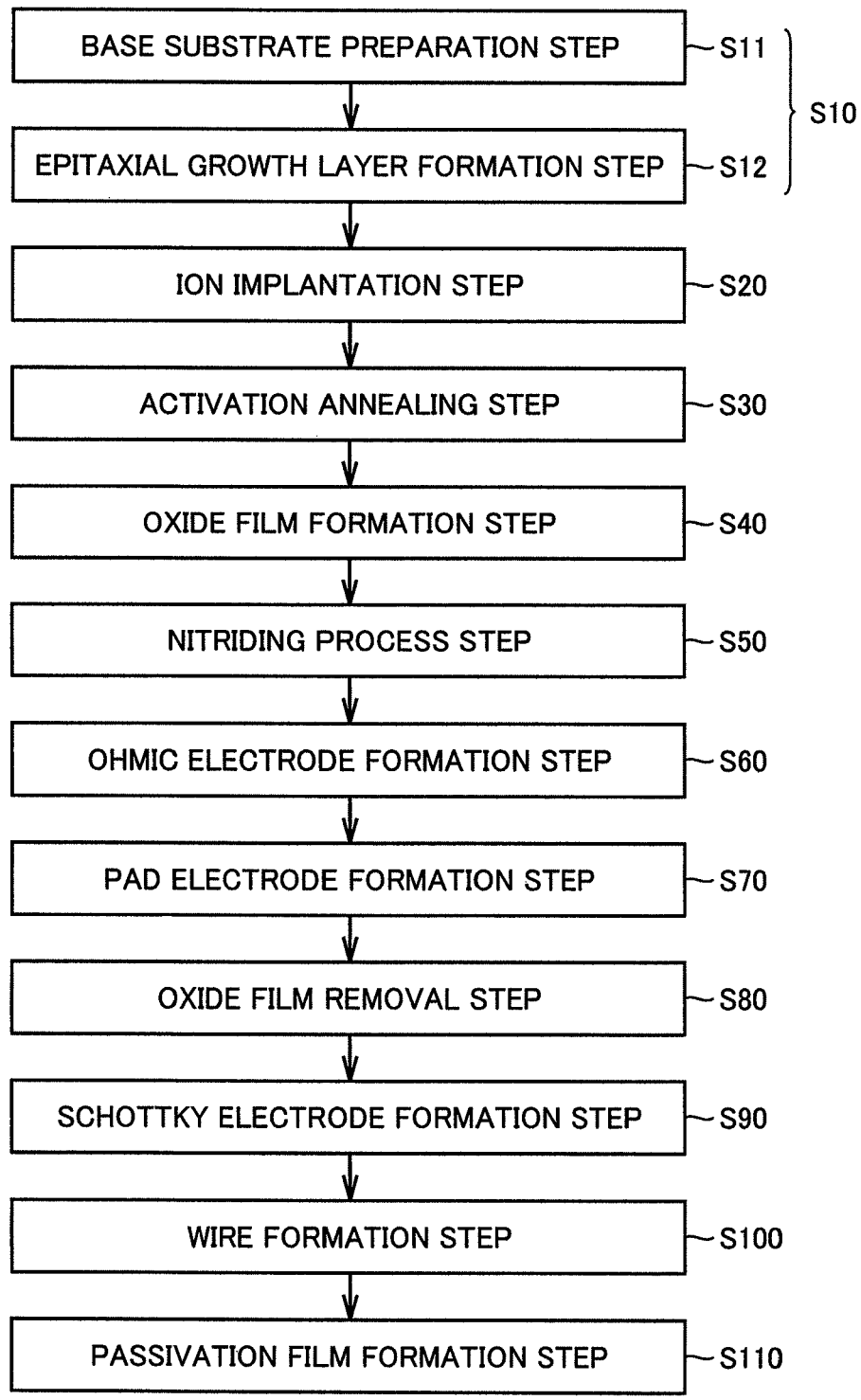
FIG. 1 is a flowchart schematically showing a method for manufacturing a JBS.
Figure 5:
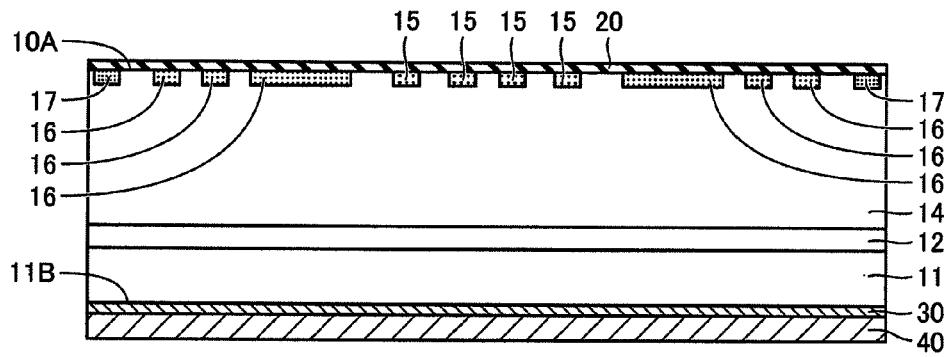
FIG. 5 is a schematic cross-sectional view illustrating the method for manufacturing a JBS.

Embodiments of the present invention will be described below with reference to the drawings. The same reference numerals are used to identify the same or corresponding features in the following drawings, and descriptions thereof will not be repeated.

First Embodiment

Referring to FIGS. 1 to 8, first, a method for manufacturing a semiconductor device according to a first embodiment which is one embodiment of the present invention is described. Referring to FIG. 1, first, as a step (S10), a substrate preparation step is performed. In this step (S10), steps (S11) and (S12) to be described below are performed to prepare a substrate 10 made of silicon carbide.

First, as a step (S11), a base substrate preparation step is performed. In this step (S11), referring to FIG. 2, an ingot made of 4H-SiC (not shown) is cut into a slice, for example, to prepare a base substrate 11 made of silicon carbide and having an n conductivity type.

Next, as a step (S12), an epitaxial growth layer formation step is performed. In this step (S12), referring to FIG. 2, first, an electric field stop layer 12 having an n conductivity type is formed by epitaxial growth on a main surface 11A of base substrate 11. Then, a semiconductor layer 13 having an n conductivity type is similarly formed by epitaxial growth on a main surface of electric field stop layer 12 opposite to base substrate 11. As such, substrate 10 having a main surface 10A and formed of base substrate 11, electric field stop layer 12 and semiconductor layer 13 is prepared.

Next, as a step (S20), an ion implantation step is performed. In this step (S20), referring to FIG. 3, first, Al (aluminum) ions are implanted into semiconductor layer 13 as indicated with arrows in the figure, for example, to form p regions 15 having a p conductivity type. Then, Al ions are implanted into an area of semiconductor layer 13 which is closer to the outer edge than p regions 15, for example, to form guard ring regions 16 having a p conductivity type. Then, P (phosphorus) ions are implanted into an area of semiconductor layer 13 which is closer to the outer edge than guard ring regions 16, for example, to form a field stop region 17 having an n conductivity type. As such, p regions 15 and guard ring regions 16 as p type (second conductivity type) regions, and field stop region 17 as an n type (first conductivity type) region are formed in a region including main surface 10A of substrate 10. Put another way, p regions 15, guard ring regions 16 surrounding p regions 15, and field stop region 17 surrounding p regions 15 and guard ring regions 16 are formed in the region including main surface 10A of substrate 10. A region in semiconductor layer 13 in which neither of p regions 15, guard ring regions 16 and field stop region 17 is formed is a drift region 14, which forms an n type region together with field stop region 17. In this step (S20), the ion implantations can be performed after a mask made of SiO2 (silicon dioxide) is formed on main surface 10A of substrate 10, for example, to form the impurity regions in desired positions in semiconductor layer 13, as shown in FIG. 3.

Next, as a step (S30), an activation annealing step is performed. In this step (S30), substrate 10 is heated at a temperature of 1700° C. for 30 minutes, for example, to activate the impurities introduced in the step (S20). As such, desired carriers are generated in the regions where the impurities have been introduced.

Next, as a step (S40), an oxide film formation step is performed. In this step (S40), referring to FIG. 4, an oxide film 20 made of $SiO_2$ (silicon dioxide) is formed, for example, to cover main surface 10A of substrate 10. Specifically, substrate 10 is heated at a temperature of 1250° C. or more in an oxygen-containing atmosphere, to form oxide film 20 on main surface 10A across drift region 14 and field stop region 17 as n type regions, and p regions 15 and guard ring regions 16 as p type regions.

Next, as a step (S50), a nitriding process step is performed. In this step (S50), substrate 10 is heated in an atmosphere containing a gas including nitrogen atoms such as NO (nitric oxide), $NO_2$ (nitrogen dioxide) or $N_2O$ (nitrous oxide), for example, to introduce the nitrogen atoms into a region including an interface between oxide film 20 and the silicon carbide that forms substrate 10. Although this step (S50) is not an essential step of the method for manufacturing a semiconductor device of the present invention, if this step is performed, an interface state of the region including the interface between oxide film 20 and the silicon carbide that forms substrate 10 can be reduced, to further improve breakdown voltage characteristics of a JBS 1. After the introduction of nitrogen atoms is completed, $SiO_2$ (silicon dioxide) may further be deposited on oxide film 20 by CVD (Chemical Vapor Deposition), for example. Although this is not an essential step of the method for manufacturing a semiconductor device of the present invention, either, if this step is performed, oxide film 20 having a greater thickness can be formed.

Next, as a step (S60), an ohmic electrode formation step is performed. In this step (S60), referring to FIG. 5, first, a metallic film made of Ni (not shown) is formed by sputtering, for example, on a main surface 11B of base substrate 11 opposite to main surface 11A. Then, the metallic film is heated at 1000° C., for example, to silicidize at least a part of the metallic film. As such, an ohmic electrode 30 electrically connected to base substrate 11 is formed.

Next, as a step (S70), a pad electrode formation step is performed. In this step (S70), referring to FIG. 5, a pad electrode 40 made of a conductor such as NiAu and TiAu is formed on ohmic electrode 30 by evaporation, for example.

Figure 6:
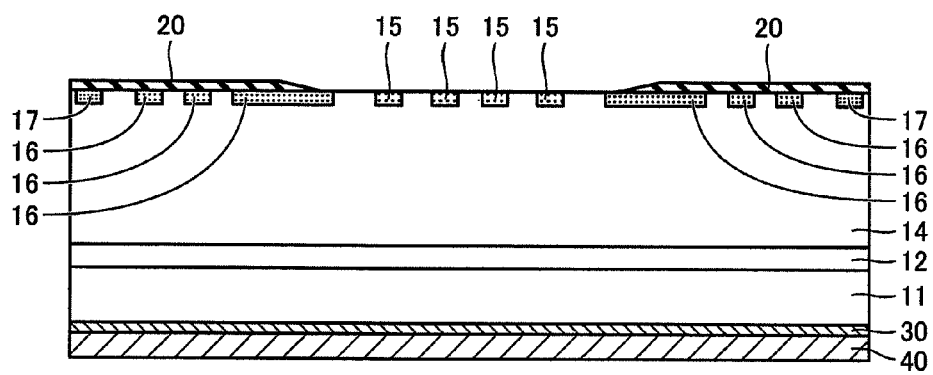
FIG. 6 is a schematic cross-sectional view illustrating the method for manufacturing a JBS.
Figure 7:
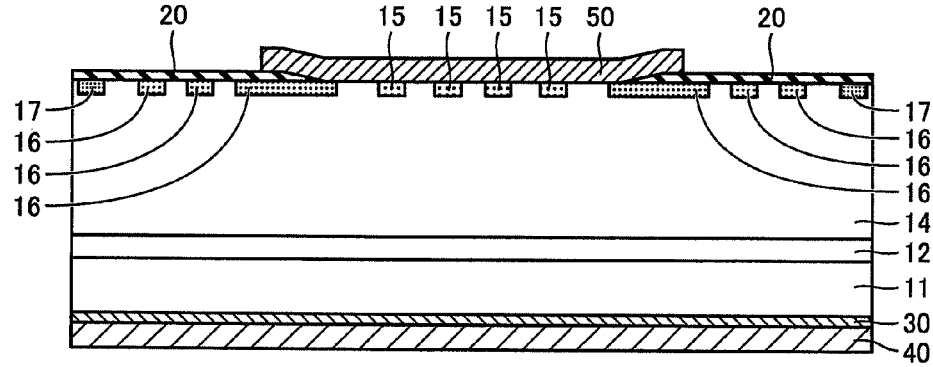
FIG. 7 is a schematic cross-sectional view illustrating the method for manufacturing a JBS.
Figure 8:
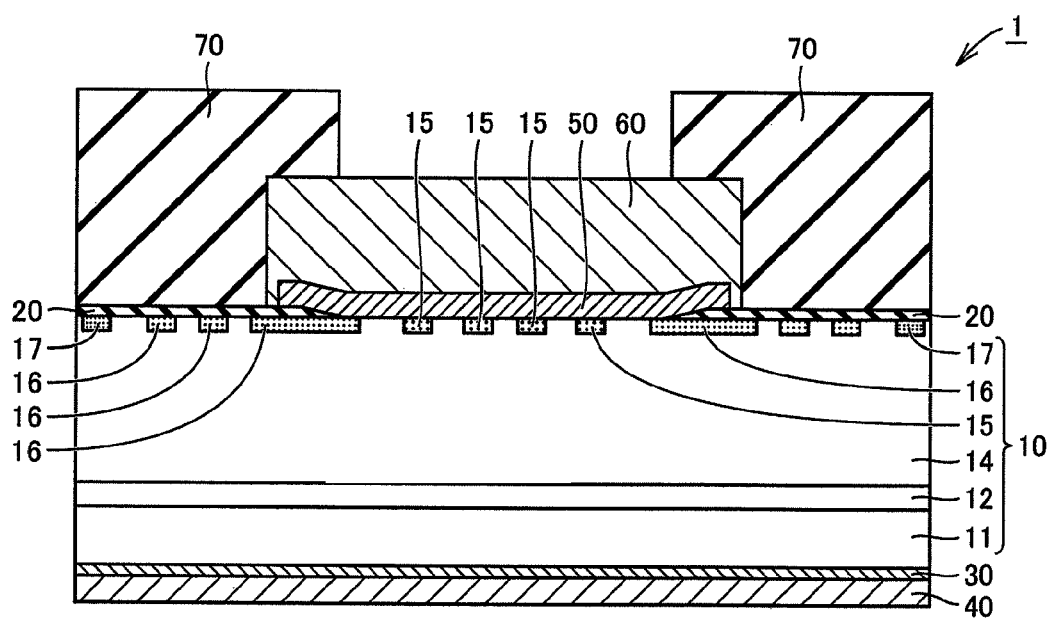
FIG. 8 is a schematic cross-sectional view illustrating the method for manufacturing a JBS.

Next, as a step (S80), an oxide film removal step is performed. In this step (S80), oxide film 20 is removed to expose a part of main surface 10A of substrate 10. Specifically, oxide film 20 is removed to expose a part of drift region 14 and p regions 15, as shown in FIG. 6, by dry etching such as RIE (Reactive Ion Etching) and wet etching with hydrofluoric acid, for example. If $SiO_2$ (silicon dioxide) is further deposited on oxide film 20 that has been formed by thermal oxidation in the step (S40) as described above, in this step (S80), oxide film 20 formed by thermal oxidation and the $SiO_2$ (silicon dioxide) deposited on oxide film 20 are removed to expose a part of main surface 10A of substrate 10.

Next, as a step (S90), a Schottky electrode formation step is performed. In this step (S90), referring to FIG. 7, a Schottky electrode 50 is formed in contact with main surface 10A of substrate 10 that has been exposed by removing oxide film 20 in the step (S80) and with oxide film 20. Specifically, first, a metallic film made of Ti or TiAl (not shown) is formed on main surface 10A and oxide film 20 by sputtering, for example. Then, the metallic film is heated at 500° C., for example, to silicidize at least a part of the metallic film, to form Schottky electrode 50 having thickness of 0.1 µm or more in contact with main surface 10A, across one of oxide films 20 and the other oxide film 20 with the contact portion interposed therebetween.

In this step (S90), Schottky electrode 50 including at least one metal selected from the group consisting of Ti, W, Mo, Ni, Ta, Al and Au may be formed, or Schottky electrode 50 made of one metal selected from the group of metals above may be formed. Alternatively, Schottky electrode 50 made of an alloy of two or more metals selected from the group of metals above such as TiW or TiTa may be formed. Alternatively, Schottky electrode 50 having a metallic film made of one metal selected from the group of metals above and a metallic film made of another metal laminated one above the other may be formed. Still alternatively, Schottky electrode 50 made of nitride of one metal selected from the group of metals above such as TiN may be formed. As such, various types of materials capable of making Schottky contact with substrate 10 can be employed as a material for Schottky electrode 50.

Next, as a step (S100), a wire formation step is performed. In this step (S100), referring to FIG. 8, a wire 60 made of a conductor such as Al is formed to surround Schottky electrode 50 by evaporation, for example.

Next, as a step (S110), a passivation film formation step is performed. In this step (S110), referring to FIG. 8, a passivation film 70 made of $SiO_2$ (silicon dioxide) is formed on oxide film 20 and wire 60 by CVD, for example. By performing the steps (S10) to (S110), JBS 1 is manufactured, and the method for manufacturing a semiconductor device according to this embodiment is completed.

As described above, in the method for manufacturing a semiconductor device according to this embodiment, substrate 10 is heated at a temperature of 1250° C. or more in the step (S40). Thus, the rate of formation of oxide film 20 can be less dependent on the conductivity type, to form oxide film 20 with suppressed variation in film thickness. Accordingly, the surface roughness of main surface 10A of substrate 10 exposed by removing oxide film 20 can be reduced, to obtain a satisfactory contact state between substrate 10 and Schottky electrode 50 formed on main surface 10A of substrate 10. According to the method for manufacturing a semiconductor device of this embodiment, therefore, by obtaining the satisfactory contact state between substrate 10 and Schottky electrode 50, JBS 1 with improved breakdown voltage characteristics can be manufactured.

Furthermore, in the method for manufacturing a semiconductor device according to this embodiment, oxide film 20 is removed to expose a part of main surface 10A of substrate 10, and Schottky electrode 50 is formed in contact with main surface 10 that has been exposed by removing oxide film 20, and with remaining oxide film 20. Namely, remaining oxide film 20 can function as an electric field relaxation FP (Field Plate) to avoid electric field concentration at opposing ends of Schottky electrode 50, thereby further improving the breakdown voltage characteristics of JBS 1. Moreover, in the method for manufacturing a semiconductor device according to this embodiment, oxide film 20 is formed by heating substrate 10 at 1250° C. or more as described above. As such, the roughness of the interface between substrate 10 and oxide film 20 can be reduced, to further improve the function of oxide film 20 as an electric field relaxation FP. If $SiO_2$ (silicon dioxide) is further deposited on oxide film 20 that has been formed by thermal oxidation in the step (S40), and if oxide film 20 formed by thermal oxidation and the $SiO_2$ (silicon dioxide) deposited on oxide film 20 are removed in the step (S80), as described above, oxide film 20 having a greater thickness can be left, to further improve the function of oxide film 20 as an electric field relaxation FP.

In the method for manufacturing a semiconductor device according to this embodiment, in the step (S40), oxide film 20 having thickness of 0.1 µm or more may be formed. It is preferable to set the thickness of oxide film 20 within such a practically suitable range, namely, within a range required to avoid breakdown of oxide film 20.

Second Embodiment

Next, a method for manufacturing a semiconductor device according to a second embodiment which is another embodiment of the present invention will be described. The method for manufacturing a semiconductor device according to this embodiment is basically implemented similarly to that as discussed above with regard to the semiconductor device according to the first embodiment, and provides similar effects. The method for manufacturing a semiconductor device according to this embodiment, however, is different from the method for manufacturing a semiconductor device according to the first embodiment in that the oxide film is removed to expose the entire main surface of the substrate in the oxide film removal step.

The method for manufacturing a semiconductor device according to this embodiment will be described. Referring to FIG. 1, first, the steps (S10) to (S70) are performed similarly to the first embodiment. The step (S50) is omitted in this embodiment.

Figure 9:
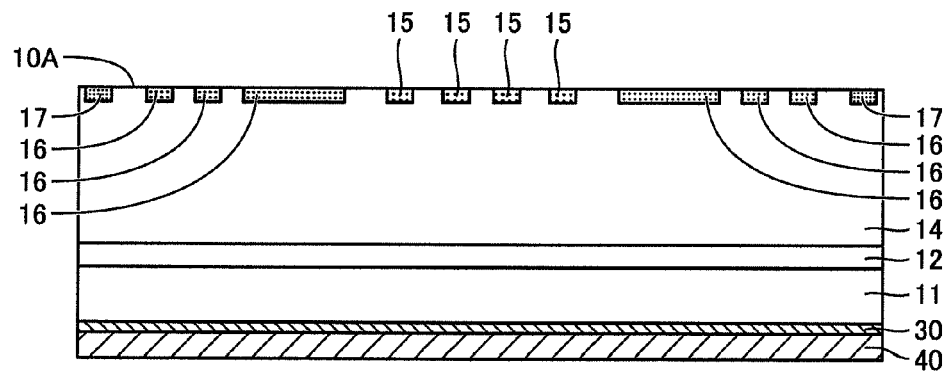
FIG. 9 is a schematic cross-sectional view illustrating a method for manufacturing a JBS according to a second embodiment.

Next, as the step (S80), the oxide film removal step is performed. In this step (S80), referring to FIG. 9, oxide film 20 is removed to expose the entire main surface 10A of substrate 10.

Figure 10:
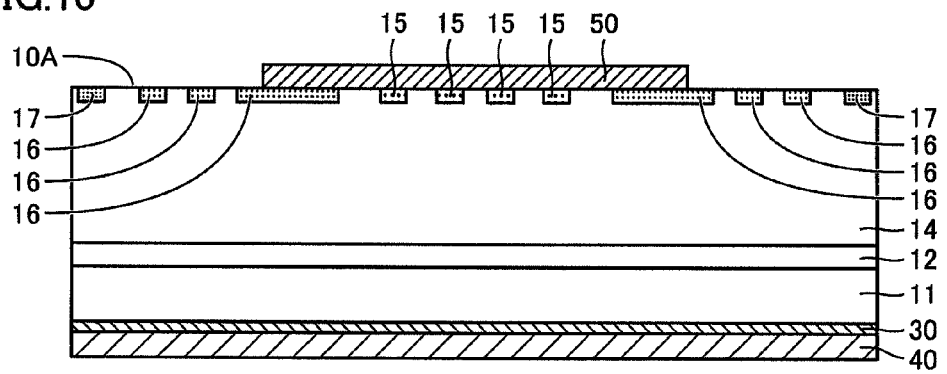
FIG. 10 is a schematic cross-sectional view illustrating the method for manufacturing a JBS according to the second embodiment.

Next, as the step (S90), the Schottky electrode formation step is performed. In this step (S90), referring to FIG. 10, Schottky electrode 50 is formed in contact with main surface 10A that has been exposed by removing oxide film 20 in the step (S80) similarly to the first embodiment.

Figure 11:
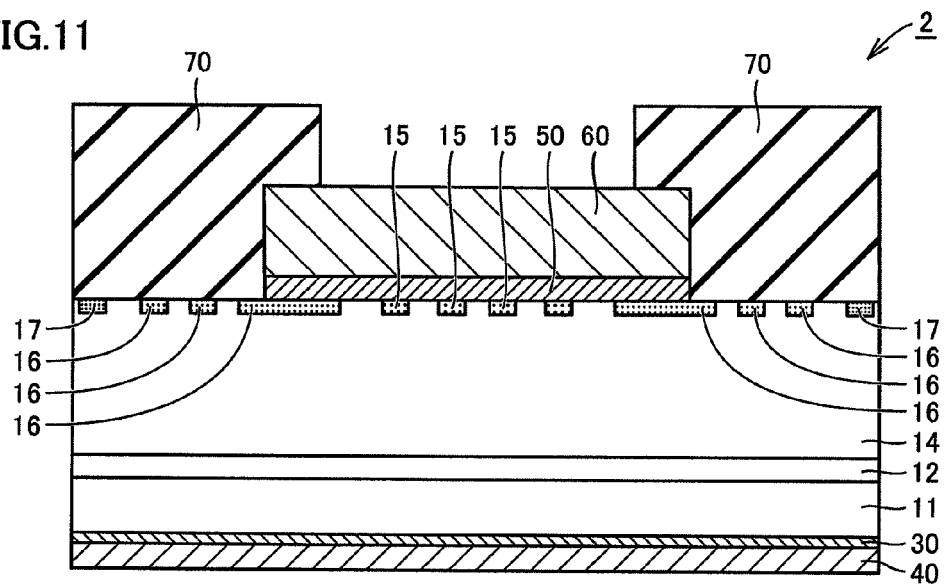
FIG. 11 is a schematic cross-sectional view illustrating the method for manufacturing a JBS according to the second embodiment.

Next, as the step (S100), the wire formation step is performed. In this step (S100), referring to FIG. 11, wire 60 is formed to surround Schottky electrode 50 similarly to the first embodiment.

Next, as the step (S110), the passivation film formation step is performed. In this step (S110), referring to FIG. 11, passivation film 70 is formed on main surface 10A of substrate 10 and wire 60. By performing the steps (S10) to (S110), a JBS 2 is manufactured, and the method for manufacturing a semiconductor device according to this embodiment is completed.

As described above, in the methods for manufacturing a semiconductor device according to the first and second embodiments of the present invention, substrate 10 is heated at a temperature of 1250° C. or more in the step (S40). Thus, the rate of formation of oxide film 20 can be less dependent on the conductivity type, to form oxide film 20 with suppressed variation in film thickness. Accordingly, the surface roughness of main surface 10A of substrate 10 exposed by removing oxide film 20 can be reduced, to obtain a satisfactory contact state between substrate 10 and Schottky electrode 50 formed on main surface 10A of substrate 10. According to the methods for manufacturing a semiconductor device of the first and second embodiments of the present invention, therefore, by obtaining the satisfactory contact state between substrate 10 and Schottky electrode 50, JBS 1 with improved breakdown voltage characteristics can be manufactured.

In the methods for manufacturing a semiconductor device according to the first and second embodiments of the present invention, in the step (S40), oxide film 20 may be formed on main surface 10A of substrate 10 by heating substrate 10 at a temperature of 1300° C. or more. As such, variation in film thickness of oxide film 20 can be suppressed more effectively. As a result, the contact between substrate 10 and Schottky electrode 50 can be further enhanced, to further improve the breakdown voltage characteristics of JBSs 1 and 2.

Although the methods for manufacturing a semiconductor device according to the first and second embodiments of the present invention are only directed to the JBSs in which p regions 15 are formed in the region including main surface 10A in contact with Schottky electrode 50, the method for manufacturing a semiconductor device of the present invention is not limited as such. Namely, the method for manufacturing a semiconductor device of the present invention can be employed in manufacturing a SBD in which p regions 15 are not formed. As such, the roughness of the interface between oxide film 20 and substrate 10 can be reduced, to manufacture a SBD with improved characteristics of oxide film 20 as an electric field relaxation FP.

Example 1

Experiments were conducted to confirm the effect of the present invention on film thickness variation of an oxide film in a method for manufacturing a semiconductor device. Specifically, first, substrates each having an n type region with a (nitrogen) concentration of $8 \times 10^{15}$ cm$^{-3}$ formed to include one main surface were prepared. Next, Al ions were implanted in concentrations of $5 \times 10^{17}$ cm$^{-3}$, $5 \times 10^{18}$ cm$^{-3}$ and $5 \times 10^{19}$ cm$^{-3}$, respectively, into a region including the main surface of the substrates, to form a p type region. Next, the substrates were heated at 1200° C., 1250° C. and 1300° C., respectively, to form an oxide film on the main surface across an n type region and the p type region. The thicknesses of the oxide films formed at the heating temperatures above were confirmed, respectively, to examine the effect of heating temperature on the average variation in film thickness of the oxide film due to the dependency of the rate of formation of the oxide film on the conductivity type.

Figure 12:
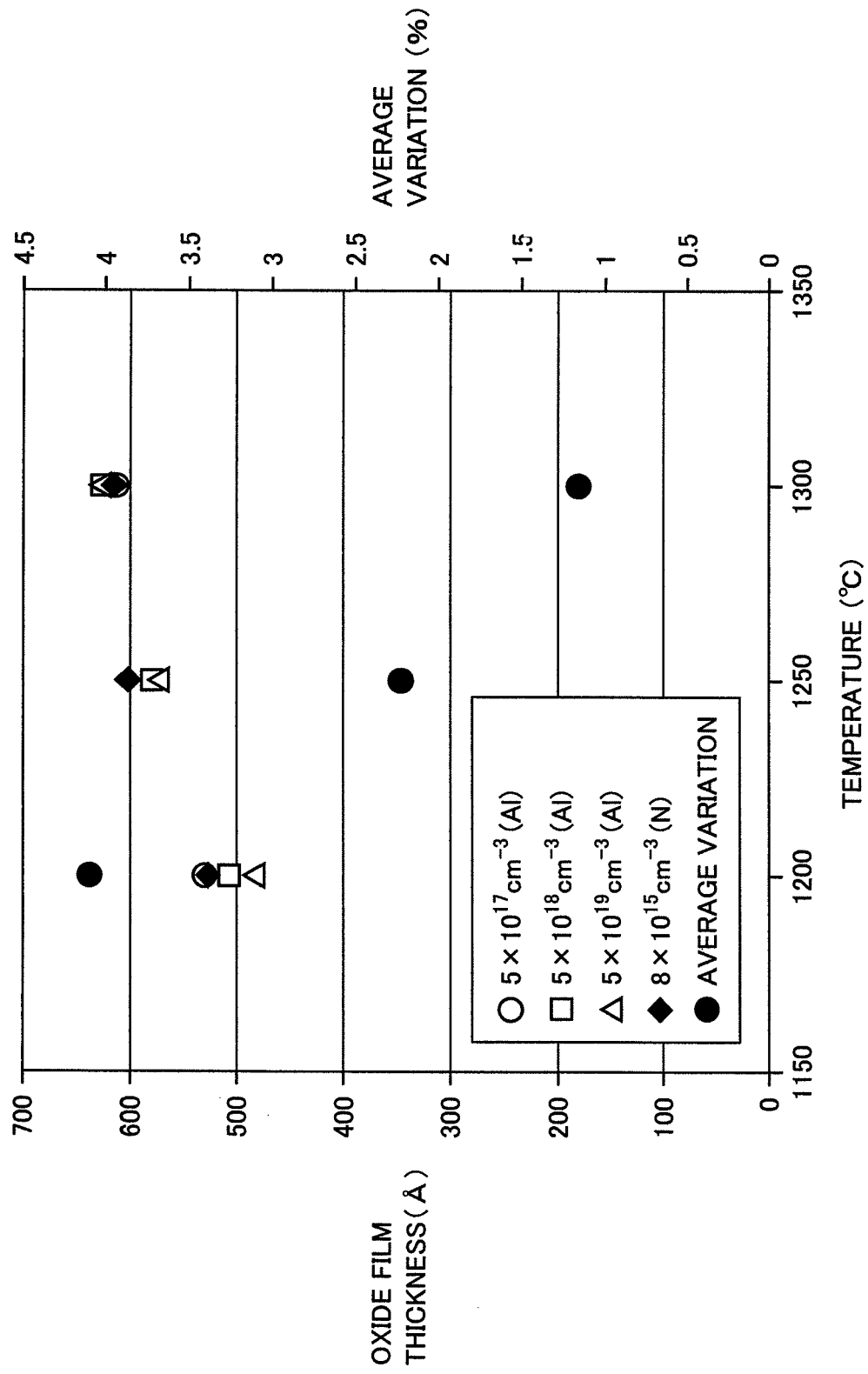
FIG. 12 illustrates the effect of heating temperature on average variation in film thickness of an oxide film.

The experimental results are described with reference to FIG. 12. FIG. 12 illustrates the effect of heating temperature on variation in film thickness of the oxide film. In FIG. 12, the abscissa represents the heating temperature (° C.) of the substrate, the left ordinate represents the thickness (Å) of the oxide film, and the right ordinate represents average variation (%) in film thickness of the oxide film. The average variation as used herein refers to a standard deviation ($\sigma$) of the film thickness of the oxide film.

As is clear from FIG. 12, when the substrate was heated at a temperature of 1250° C. or more, the average variation in film thickness of the oxide film was smaller than that when the substrate was heated at 1200° C. It was thus confirmed that the variation in film thickness of the formed oxide film could be suppressed by setting the heating temperature of the substrate when forming the oxide film to 1250° C. or more, preferably to 1300° C. or more, in the method for manufacturing a semiconductor device of the present invention.

The method for manufacturing a semiconductor device of the present invention is applicable particularly advantageously to a method for manufacturing a semiconductor device required to achieve improved breakdown voltage characteristics.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
    preparing a substrate made of silicon carbide and having a first conductivity type region formed to include one main surface;
    forming a second conductivity type region in a region including said main surface;
    forming an oxide film on said main surface across said first conductivity type region and said second conductivity type region, by heating said substrate having said second conductivity type region formed therein at a temperature of 1250° C. or more;
    removing said oxide film to expose at least a part of said main surface; and
    forming a Schottky electrode in contact with said main surface that has been exposed by removing said oxide film.

2. The method for manufacturing a semiconductor device according to claim 1, wherein
    in said step of forming an oxide film, said oxide film is formed on said main surface by heating said substrate at a temperature of 1300° C. or more.

3. The method for manufacturing a semiconductor device according to claim 1, wherein
    in said step of removing said oxide film, said oxide film is removed to expose a part of said main surface, and
    in said step of forming a Schottky electrode, said Schottky electrode is formed in contact with said main surface that has been exposed by removing said oxide film and with said oxide film.

4. The method for manufacturing a semiconductor device according to claim 3, further comprising the step of heating said substrate having said oxide film formed thereon in a nitrogen-containing atmosphere, before said step of removing said oxide film.

5. The method for manufacturing a semiconductor device according to claim 3, wherein
in said step of forming an oxide film, said oxide film having a thickness of 0.1 μm or more is formed.

6. The method for manufacturing a semiconductor device according to claim 1, wherein
in said step of removing said oxide film, said oxide film is removed to expose the entire said main surface.

7. The method for manufacturing a semiconductor device according to claim 1, wherein
in said step of forming a Schottky electrode, said Schottky electrode including at least one selected from the group consisting of Ti, W, Mo, Ni, Ta, Al and Au is formed.

* * * * *